(12) United States Patent
Amos et al.

(10) Patent No.: US 7,459,382 B2
(45) Date of Patent: Dec. 2, 2008

(54) FIELD EFFECT DEVICE WITH REDUCED THICKNESS GATE

(75) Inventors: Ricky S. Amos, Rhinebeck, NY (US);
Wesley C. Natzle, New Paltz, NY (US);
Siddhartha Panda, Beacon, NY (US);
Brian L. Tessier, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 11/308,432

(22) Filed: Mar. 24, 2006

(65) Prior Publication Data

US 2007/0221964 A1  Sep. 27, 2007

(51) Int. Cl.
*H01L 21/44* (2006.01)
*H01L 21/28* (2006.01)

(52) U.S. Cl. .................. 438/583; 438/581; 438/682; 257/E21.439

(58) Field of Classification Search ................ 438/581, 438/583, 630, 682; 257/E21.439
See application file for complete search history.

(56) References Cited

U.S. PATENT DOCUMENTS

| | | | |
|---|---|---|---|
| 5,814,537 A * | 9/1998 | Maa et al. ................ | 438/151 |
| 6,171,916 B1 | 1/2001 | Sugawara et al. | |
| 6,495,438 B1 * | 12/2002 | Shinmura ................ | 438/592 |
| 6,534,388 B1 * | 3/2003 | Lin et al. ................ | 438/510 |
| 6,562,718 B1 | 5/2003 | Xiang et al. | |
| 6,902,994 B2 | 6/2005 | Gong et al. | |
| 6,905,922 B2 | 6/2005 | Lin et al. | |
| 7,067,391 B2 * | 6/2006 | Chan et al. .............. | 438/446 |
| 7,172,933 B2 * | 2/2007 | Huang et al. ............ | 438/197 |
| 7,297,618 B1 * | 11/2007 | Henson et al. .......... | 438/581 |
| 2002/0106875 A1 * | 8/2002 | Joyner et al. ............ | 438/581 |
| 2002/0190284 A1 * | 12/2002 | Murthy et al. .......... | 257/286 |
| 2005/0156238 A1 | 7/2005 | Wen et al. | |
| 2005/0215055 A1 | 9/2005 | Bu et al. | |
| 2006/0163624 A1 * | 7/2006 | Kuroi ...................... | 257/288 |

FOREIGN PATENT DOCUMENTS

| CN | 1527379 A | 9/2004 |
|---|---|---|
| CN | 1685520 A | 10/2005 |

* cited by examiner

*Primary Examiner*—Scott B. Geyer
*Assistant Examiner*—Seahvosh J Nikmanesh
(74) *Attorney, Agent, or Firm*—Scully, Scott, Murphy & Presser; Joseph P. Abate, Esq.

(57) ABSTRACT

A semiconductor structure is fabricated with reduced gate capacitance by thinning of a gate electrode to provide a reduced thickness gate electrode. The gate electrode is thinned after forming a spacer layer adjoining the gate electrode. In addition, the height of the spacer layer may also be reduced. The spacer layer thus has an enhanced horizontal width desired for locating an intrinsic source/drain with respect to an extension region and in particular, an enhanced horizontal width relative to the spacer height. The reduced thickness gate electrode may be fully silicided to provide decreased gate resistance. A raised source/drain layer may be located upon the intrinsic source/drain region. The raised source/drain layer may have a top surface higher than the reduced thickness gate electrode. In addition, the raised source/drain layer may have a top surface higher than the reduced height spacer layer.

1 Claim, 4 Drawing Sheets

FIELD EFFECT DEVICE WITH REDUCED THICKNESS GATE

BACKGROUND

1. Field of the Invention

The invention relates generally to semiconductor devices such as field effect transistor (FET) devices. More particularly, the invention relates to efficient methods for fabricating semiconductor devices, such as field effect transistor devices with enhanced performance.

2. Description of the Related Art

Integrated circuits commonly comprise field effect transistor devices as active switching elements. For purposes of reducing power consumption, field effect transistor devices are typically provided as complementary doped pairs. Various factors affect field effect transistor device performance. Non-limiting examples of such factors include dimensional, materials of composition, mechanical stress effect and doping related factors.

Attention has recently focused upon the gate electrode composition related performance effects when fabricating field effect transistor devices. To that end, field effect transistor devices fabricated with fully silicided gate electrodes are desirable since fully silicided gate electrodes often have enhanced conductivity, and they are not subject to polysilicon dopant depletion phenomena. Fully silicided gate electrodes also have other performance advantages in comparison with other gate electrode materials.

Various field effect transistor structures using suicide gate electrodes, and methods for fabrication thereof, are known in the art.

For example, Xiang et al., in U.S. Pat. No. 6,562,718, teaches a method for fabricating a field effect transistor structure with a fully silicided gate electrode. The method disclosed in the '718 patent uses a shielding layer located upon a pair of silicided source/drain regions, but not a partially silicided gate electrode within the field effect transistor structure, so that the partially silicided gate electrode may be fully silicided without affecting the silicided source/drain regions.

In addition, Gong et al., in U.S. Pat. No. 6,902,994, teaches an additional method for fabricating a field effect transistor structure with a fully silicided gate electrode. The method disclosed in the '994 patent provides for simultaneous silicidation of a pair of raised source/drain regions and a silicon gate electrode after removing a capping layer used to protect the silicon gate electrode when forming the pair of raised source/drain regions.

Further, Lin et al., in U.S. Pat. No. 6,905,922, teaches a method for fabricating dual fully silicided gate electrodes within field effect transistor structures. This prior method uses a protective layer formed upon a pair of silicided source/drain regions when fully siliciding the gate electrodes.

Still further, Wen et al., in U.S. Patent Application Publication 2005/0156238, also teaches a silicided gate field effect transistor structure and a method for fabricating the same. The Wen et al. method provides for protecting a pair of silicided source/drain regions when siliciding a silicon gate electrode within the field effect transistor device.

Finally, Bu et al., in U.S. Patent Application Publication 2005/0215055, also teaches a silicided gate field effect transistor structure and a method for fabricating the same. The Bu et al. method provides for forming a silicided gate electrode prior to a pair of sillicided source/drain regions.

As semiconductor device technology continues to advance, needs continue to exist for fabricating field effect transistor devices with enhanced performance. To that end, desirable are additional field effect transistor structures having silicided gate electrodes, as well as methods for fabrication thereof.

SUMMARY OF THE INVENTION

The invention provides a semiconductor structure, in particularly a field effect transistor structure, and methods for fabricating the same.

A semiconductor structure in accordance with the invention comprises a semiconductor substrate having a channel region separating a pair of source/drain regions. The structure also includes a gate electrode located over the channel region. Within the structure, a top surface of the gate electrode is no higher than a top surface of the pair of source/drain regions.

One method for fabricating the inventive structure includes forming an extension region into a semiconductor substrate which includes at least a gate electrode of a first thickness thereon. The gate electrode serves as a mask when forming the extension region. The method also includes forming an intrinsic source/drain region into the semiconductor substrate while using the gate electrode and a horizontal spacer layer formed adjacent thereto as a mask. Finally, the method also includes etching the gate electrode to a second thickness which is less than the first thickness, thereby forming a reduced thickness gate electrode.

Another method for fabricating a semiconductor structure in accordance with the invention includes forming an extension region into a semiconductor substrate which includes at least a gate electrode stack thereon. The gate electrode stack serves as a mask when forming the extension region. The gate electrode stack includes a reduced thickness gate electrode, an etch stop layer thereupon and a vertical spacer layer further thereupon. The method also includes forming an intrinsic source/drain region into the semiconductor substrate while using the gate electrode stack and a horizontal spacer layer formed adjacent thereto as a mask. Finally, the method includes stripping the vertical spacer layer from the gate electrode stack while using the etch stop layer as a stop layer, and then further stripping the etch stop layer to expose the reduced thickness gate electrode.

Within the foregoing structure, and methods of forming the same, the gate electrode or reduced thickness gate electrode may be fully silicided.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The present invention, which provides a semiconductor structure having a reduced gate thickness and methods for fabricating the same, will now be described in greater detail.

Reference is first made to FIGS. 1-8 which show a series of schematic cross-sectional diagrams illustrating the results of progressive stages in fabricating a field effect transistor device in accordance with a first embodiment of the invention.

Figure 1:
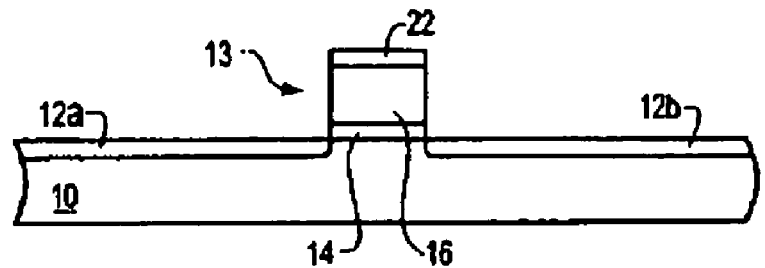
FIG. 1 to FIG. 8 show a series of schematic cross-sectional diagrams illustrating the results of progressive stages in fabricating a field effect transistor device in accordance with a first embodiment of the invention.

FIG. 1 shows a semiconductor substrate 10 having a pair of extension regions 12a and 12b located within the semiconductor substrate 10. The pair of extension regions 12a and 12b is separated by a channel region within the semiconductor substrate 10. Located above the channel region is a gate electrode stack 13. The gate electrode stack 13 comprises, in progressively layered sequence upon the channel region within the semiconductor substrate 10: (1) a gate dielectric 14; (2) a silicon gate electrode 16 located upon the gate dielectric 14; and (3) a capping layer 22 located upon the silicon gate electrode 16.

Each of the foregoing semiconductor substrate 10, layers and structures may comprise materials, have dimensions and be formed using methods that are otherwise conventional in the semiconductor fabrication art.

The semiconductor substrate 10 may comprise semiconductor materials including, but not limited to: silicon, germanium, silicon-germanium alloy, silicon carbide, silicon-germanium carbide alloy, or compound semiconductor materials. Non-limiting examples of compound semiconductor materials include gallium arsenide, indium arsenide and indium phosphide semiconductor materials. The semiconductor substrate 10 may comprise a bulk semiconductor substrate (as is generally illustrated in FIG. 1) or it may alternatively comprise a semiconductor-on-insulator substrate (as might more specifically be illustrated within FIG. 1 when the semiconductor substrate 10 additionally comprises and illustrates a buried dielectric layer that separates a lower base semiconductor substrate and a surface semiconductor layer within the semiconductor substrate 10). The semiconductor substrate 10 may also comprise a hybrid orientation technology semiconductor substrate that further comprises multiple regions with different crystallographic orientations.

The pair of extension regions 12a and 12b comprise either N or P polarity dopants that are appropriate for the polarity of the field effect transistor desired to be fabricated in accordance with the first embodiment. The pair of extension regions 12a and 12b is formed into the semiconductor substrate 10 while using the gate electrode stack 13 (and in particular the silicon gate electrode 16) as a mask, and while using an ion implant method and materials that are otherwise generally conventional in the semiconductor fabrication art. The pair of extension regions 12a and 12b will typically have either an N or a P polarity. Each of the pair of extension regions 12a and 12b is typically formed using a dopant dose from about 1e15 to about 2e15 dopant atoms per square centimeter.

The gate dielectric 14 may comprise generally conventional dielectric materials, such as silicon oxides, silicon nitrides and silicon oxynitrides having a dielectric constant from about 4 to about 20, measured in a vacuum. Alternatively, the gate dielectric 14 may comprise generally higher dielectric constant dielectric materials having a dielectric constant from 20 to at least about 100. Such higher dielectric constant dielectric materials may include, but are not limited to: hafnium oxides, hafnium silicates, titanium oxides, rare earth oxides, barium-strontium titanates (BSTs) and lead-zirconate titanates (PZTs). The dielectric materials may be formed using methods including, but not limited to: thermal or plasma deposition or annealing methods, chemical vapor deposition methods, atomic layer deposition methods and physical vapor deposition methods. Typically, the gate dielectric 14 comprises a thermal silicon oxide material having a thickness from about 10 to about 70 angstroms.

The silicon gate electrode 16 may comprise any of several silicon materials, as well as silicon-germanium alloy materials with germanium concentrations from about zero to about 100 atomic percent germanium. Alternatively, the silicon gate electrode 16 may comprise a laminate comprising germanium followed by any of several silicon materials. The silicon or silicon-germanium alloy materials may include, but are not limited to: polycrystalline materials and amorphous materials. Polycrystalline silicon and silicon-germanium alloy materials are most common. The silicon gate electrode 16 may be deposited using methods that are conventional in the art. The methods may include, but are not limited to: chemical vapor deposition methods and physical vapor deposition methods. Typically, the silicon gate electrode 16 comprises a polycrystalline silicon material that has a thickness from about 700 to about 1000 angstroms.

The capping layer 22 may comprise any of several capping materials. Typically, the capping layer 22 comprises a dielectric capping material. Silicon oxide, silicon nitride and silicon oxynitride dielectric capping materials are common. A silicon nitride capping material is often desirable and thus common. The capping layer 22 may be deposited using generally conventional methods that are used for depositing the gate dielectric 14 and the silicon gate electrode 16. Typically, the capping layer 22 has a thickness from about 200 to about 400 angstroms.

In order to fabricate the semiconductor structure that is illustrated in FIG. 1, the semiconductor substrate 10 is first provided. In sequence, a blanket gate dielectric layer, a blanket silicon layer and a blanket capping layer are formed upon or over the semiconductor substrate 10. The foregoing blanket layers are then sequentially patterned while using a patterned photoresist layer (not shown) as an etch mask layer, to provide the gate electrode stack 13 shown in FIG. 1. The gate electrode stack 13 is then used as an ion implantation mask for forming the pair of extension regions 12a and 12b within the semiconductor substrate 10.

Figure 2:
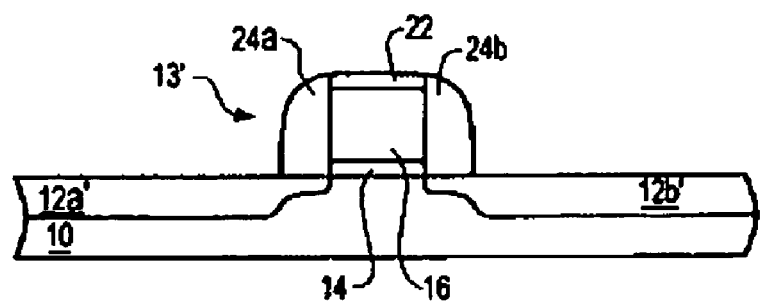

FIG. 2 shows a pair of horizontal spacer layers 24a and 24b located adjacent and adjoining a pair of opposite sidewalls of the gate dielectric 14, the gate electrode 16 and the capping layer 22, to thus provide a spacer clad gate electrode stack 13'. It should be appreciated that the pair of horizontal spacer layers 24a and 24b is for the cross-section illustrated. In a top down view, the pair of horizontal spacers form a single spacer that is present around the gate stack region.

The pair of horizontal spacer layers 24a and 24b may comprise a spacer material including, but not limited to: conductor spacer materials, semiconductor spacer materials and dielectric spacer materials. Dielectric spacer materials are most common, but conductor spacer materials are also known. Also known are laminates of dielectric spacer materials and conductor spacer materials. Typically, the pair of spacer layers 24a and 24b is formed using a blanket spacer material layer deposition and anisotropic etchback method. The blanket spacer material layer may be deposited using any of several methods. Non-limiting examples include thermal or plasma oxidation or nitridation methods, chemical vapor deposition methods and physical vapor deposition methods.

FIG. 2 also shows a pair of intrinsic source/drain regions 12a' and 12b' located within the semiconductor substrate 10 and incorporating the pair of extension regions 12a and 12b. The pair of intrinsic source/drain regions 12a' and 12b' is formed using a second ion implantation method, while using the spacer clad gate electrode stack 13' (including in particular the silicon gate electrode 16) as a mask. Implanted are ions of the same polarity that are used when forming the pair of extension regions 12a and 12b that are illustrated in FIG. 1. Typically, the pair of intrinsic source/drain regions 12a' and 12b' is implanted to provide a concentration from about 1e18 to about 1e22 dopant atoms per cubic centimeter. Under certain circumstances, (e.g., particularly with raised source/drain regions as discussed below) junction depths for the pair of intrinsic source/drain regions 12a' and 12b' need not necessarily be deeper than junction depths for the pair of extension regions 12a and 12b.

As is understood by a person skilled in the art, a horizontal dimension of the pair of horizontal spacer layers 24a and 24b governs a horizontal offset and extension of the pair of extension regions 12a and 12b that is incorporated into the pair of intrinsic source/drain regions 12a' and 12b'. In turn, when the pair of horizontal spacer layers 24a and 24b is formed using a blanket layer deposition and anisotropic etchback method, the horizontal dimension of the pair of horizontal spacer layers 24a and 24b is governed by the height of the gate electrode stack 13 that includes the gate electrode 16. Thus, in order to provide a wider horizontal offset of the pair of extension regions 12a and 12b with respect to the pair of intrinsic source/drain regions 12a' and 12b', the gate electrode stack 13 that is illustrated in FIG. 1 must be higher.

Figure 3:
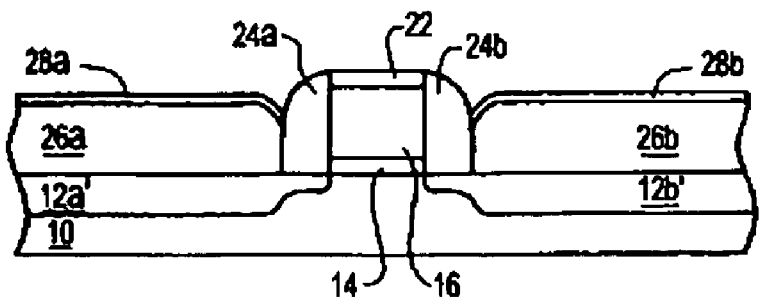

FIG. 3 shows a pair of raised source/drain layers 26a and 26b that are located upon the pair of intrinsic source/drain regions 12a' and 12b'. Within the context of the instant embodiment and the invention either: (1) the pair of intrinsic source/drain regions 12a' and 12b' themselves; or (2) the laminated pair comprising intrinsic source/drain regions 12a' and 12b' laminated with raised source/drain layers 26a and 26b, is intended as a pair of "source/drain regions." FIG. 3 also shows a pair of protective layers 28a and 28b located upon the pair of raised source/drain layers 26a and 26b.

The pair of raised source/drain layers 26a and 26b typically has the same crystallographic orientation as the pair of intrinsic source/drain regions 12a' and 12b'. The pair of raised source/drain layers 26a and 26b is typically formed using an epitaxial chemical vapor deposition method. This method may provide for intrinsic doping of the pair of raised source/drain layers 26a and 26b (i.e., of same polarity as the pair of intrinsic source/drain regions 12a' and 12b'). Alternatively, the pair of raised source/drain layers 26a and 26b may be subsequently doped using methods such as, but not limited to: ion implantation methods and thermal diffusion methods.

In addition, while the pair of raised source/drain layers 26a and 26b typically comprises the same semiconductor material as the pair of intrinsic source/drain regions 12a' and 12b', neither the embodiment nor the invention is so limited. Rather, the pair of raised source/drain layers 26a and 26b may comprise a different semiconductor material, particularly under circumstances where the pair of raised source/drain layers 26a and 26b may assist in providing a mechanical stress or strain into the channel region of the field effect transistor whose schematic cross-sectional diagram is illustrated in FIG. 3. Typically, each of the pair of raised source/drain layers 26a and 26b has a thickness from about 200 to about 1000 angstroms.

The pair of protective layers 28a and 28b may comprise any of several protective materials including, but not limited to: conductor protective materials and dielectric protective materials. The pair of protective layers 28a and 28b is intended as a pair of silicidation protective layers with respect to the pair of raised source/drain layers 26a and 26b. The pair of protective layers 28a and 28b may be formed using any of several methods. Non-limiting examples include thermal or plasma oxidation methods or nitridation methods, chemical vapor deposition methods and physical vapor deposition methods. As is illustrated in FIG. 3, the pair of protective layers 28a and 28b is preferably of a conformal shape with respect to the pair of raised source/drain layers 26a and 26b. As may be implied by the specific shape of each of the protective layers 28a and 28b, they are preferably formed selectively. Preferably, a thermal oxidation method is used to provide the pair of protective layers 28a and 28b comprising a thermal silicon oxide material having a thickness from about 100 to about 300 angstroms. During formation of the protective layers 28a and 28b, capping layer 22 protects the top of silicon gate electrode 16 from oxidation.

Figure 4:
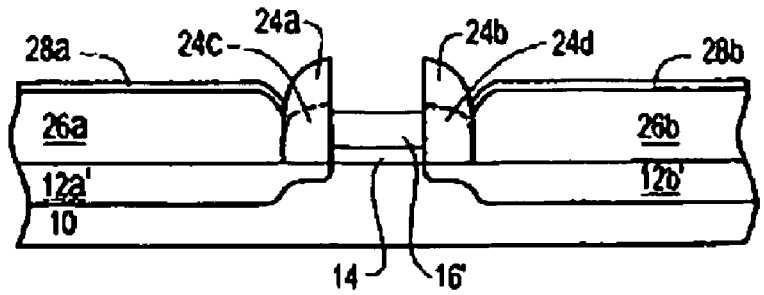

FIG. 4 first shows the results of stripping the capping layer 22 from the spacer clad gate electrode stack 13' that is illustrated in FIG. 2 and FIG. 3. FIG. 4 also shows the results of etching the silicon gate electrode 16 to form a reduced thickness silicon gate electrode 16'.

The capping layer 22 may be stripped using methods and materials that are appropriate to its materials of composition. The methods and materials may include, but are not limited to: wet chemical methods and materials, dry plasma methods and materials and aggregate methods and materials thereof. When the capping layer 22 comprises a preferred silicon nitride material, the capping layer 22 may be stripped selectively with respect to the pair of spacer layers 24a and 24b, the pair of protective layers 28a and 28b, and the silicon gate electrode 16, while using either an aqueous phosphoric acid etchant at an elevated temperature (typically from about 80° C. to about 90° C., but possibly also at a higher temperature), or alternatively a plasma etch method having an etchant gas composition engineered for the foregoing etch specificity.

Alternatively, if the capping layer 22 and the spacer layers 24a and 24b are all formed of the same material (e.g., a silicon nitride material), then a single etch step (such as, but not limited to: a dry plasma etch step or a wet chemical etch step) could simultaneously expose the top of the gate electrode 16 and reduce the height of the spacer layers 24a and 24b. If such etching is continued, a height of the spacer layers may be recessed to the level denoted by dotted lines illustrated in FIG. 4, thus providing reduced height spacer layers 24c and 24d. Alternatively, the same spacer layer recess could also be accomplished by separate etching processing steps when the capping layer 22 and the spacer layers 24a and 24b are comprised of materials with differing etch selectivities.

The gate electrode 16 may be etched to form the reduced thickness gate electrode 16' while also using an appropriate etchant that may be either a wet chemical etchant or an appropriate dry plasma etchant. Typically, the gate electrode 16 is etched to form the reduced thickness gate electrode 16' while using an anisotropic plasma etch method that uses a chlorine containing etchant gas composition. In accord with disclosure above, the gate electrode 16 preferably has a thickness from about 700 to about 1000 angstroms. The gate electrode 16 is etched to form the reduced thickness gate electrode 16' that preferably has a thickness from about 50 to about 500 angstroms.

In a particularly advantageous embodiment, the capping layer 22 is comprised of nitride and is removed by an anisotropic nitride plasma etch which is selective to a silicon dioxide protective layer 28a and 28b, then the etch chemistry is switched to a second etch chemistry which etches the silicon gate electrode 16 as described above. The second etch chemistry etches the silicon gate electrode 16 selectively to the silicon dioxide protective layers 28a and 28b. The first etch chemistry which etches nitride may comprise a $CH_3F/O_2/He$ mixture in a preferred ratio from about 1:3:4 to about 1:1:2, at a total pressure from about 20 to about 40 mTorr and at a plasma power from about 400 W to about 500 W. The second etch chemistry which etches silicon may comprise a chlorine containing plasma. $SF_6/Cl_2$ mixtures at a ratio from about 1:1 to about 4:1 using a total pressure from about 10 to about 50 mTorr and plasma powers from about 200 to about 400 W are useful when coupled with a low bias power below 100 W.

In a first instance, the schematic cross-sectional diagram of FIG. 4 illustrates a field effect transistor in part in accordance with a first embodiment of the invention. The field effect transistor has a reduced height silicon gate electrode 16' in comparison with the silicon gate electrode 16 that is illustrated in FIG. 1. As disclosed above, a thickness of the gate electrode stack 13 (including the silicon gate electrode 16) determines, in part, a horizontal dimension of a pair of horizontal spacer layers 24a and 24b that is used to determine a horizontal extension dimension of a pair of extension regions 12a and 12b incorporated within a pair of intrinsic source/drain regions 12a' and 12b'. However, for gate electrode capacitance reduction, a thinner gate electrode is desirable. Thus, the first embodiment: (1) uses a thicker silicon gate electrode 16 within a gate electrode stack 13 for purposes of forming a desirably comparatively wider sized pair of spacer layers 24a and 24b; and (2) subsequently thins the silicon gate electrode 16 to provide a reduced thickness silicon gate electrode 16' that provides reduced gate capacitance. The foregoing aspects of the present invention are realized independent of the material of composition of the spacer layers 24a and 24b and the silicon gate electrode 16 (i.e., other than a silicon gate electrode may be used). The foregoing aspects of the invention are also realized within the context of a pair of raised source/drain layers 26a and 26b. The pair of raised source/drain layers 26a and 26b is of sufficient height that the reduced thickness silicon gate electrode 16' may be not higher than, or alternatively lower than, the reduced thickness silicon gate electrode 16'. Also, spacer layers 24a and 24b may optionally be reduced in height by an appropriate etching step to a height as denoted by dotted line that is representative of reduced height spacer layers 24c and 24d. The final height of the reduced height spacer layers 24c and 24d may be below the height of the raised source/drain layers 26a and 26b.

The foregoing: (1) spacer layer width and extension region placement aspects of the first embodiment; and (2) reduced thickness silicon gate electrode capacitance reduction aspects of the first embodiment, comprise initial aspects of the first embodiment. An additional aspect of the first embodiment is the height differential between the raised source/drain layers 26a and 26b that comprise "source/drain regions," and the reduced thickness silicon gate electrode 16'. An additional aspect of the first embodiment is the height differential between the raised source/drain layers 26a and 26b that comprise "source/drain regions," and the optionally reduced height spacer layers 24c and 24d. The foregoing aspects do not, however, complete the first embodiment. Rather, a further aspect of the first embodiment is illustrated incident to further processing of the semiconductor structure whose schematic cross-sectional diagram is illustrated in FIG. 4. The further processing is illustrated within the schematic cross-sectional diagrams of FIG. 5 to FIG. 8.

Figure 5:
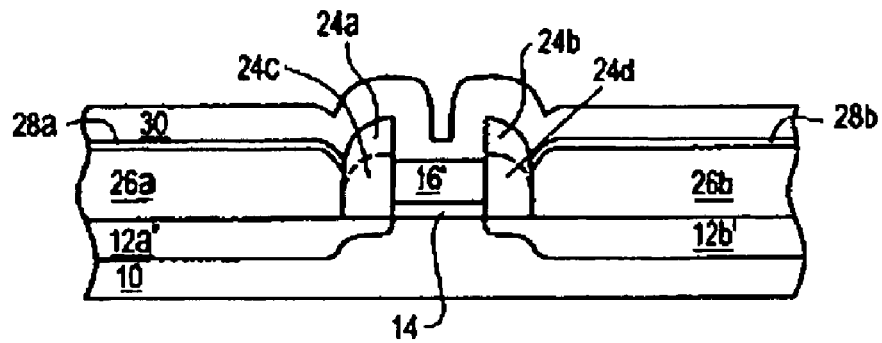

FIG. 5 shows a metal suicide forming metal layer 30 located upon the semiconductor structure whose schematic cross-sectional diagram is illustrated in FIG. 4.

The metal silicide forming metal layer 30 may comprise any of several metal silicide forming metals. Non-limiting examples include titanium, tungsten, cobalt, nickel, vanadium and platinum metal silicide forming metals. Also included are alloys including the foregoing metal silicide forming metals. The metal silicide forming metal layer 30 may be deposited using any of several methods. Non-limiting examples include evaporative and other physical vapor deposition methods, as well as chemical vapor deposition methods. Preferably, the metal silicide forming metal layer 30 has a thickness sufficient to completely consume the reduced thickness silicon gate electrode 16' when the reduced thickness silicon gate electrode 16' is thermally annealed in contact with the metal silicide forming metal layer 30. Typically, the metal silicide forming metal layer 30 has a thickness from about 20 to about 3000 angstroms in order to effect the foregoing full consumption of the reduced thickness silicon gate electrode 16'. If present, the pair of reduced height spacer layers 24c and 24d also reduces the aspect ratio of a pair of gaps adjoining thereto to be partially filled during deposition of the metal silicide forming metal layer 30. In addition, the presence of the pair of reduced height spacer layers 24c and 24d also reduces fringing capacitance of the reduced thickness silicon gate electrode 16', or a silicide gate electrode formed therefrom.

Figure 6:
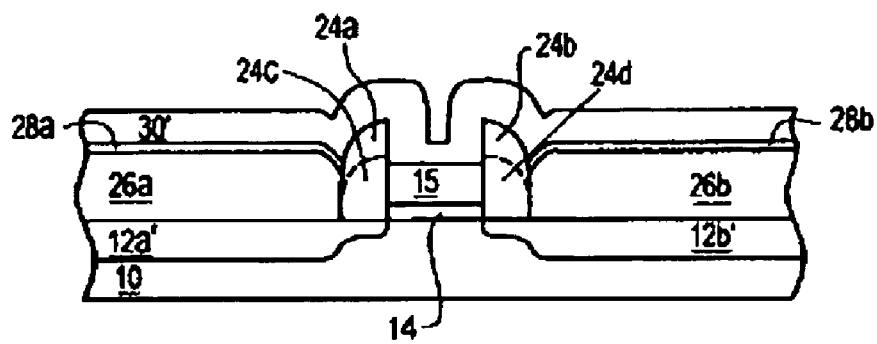

FIG. 6 shows a silicide gate electrode 15 that results from thermally annealing the reduced thickness silicon gate electrode 16' in contact with the metal silicide forming metal layer 30 that is illustrated in FIG. 5. FIG. 6 also shows a partially consumed metal silicide forming metal layer 30' that results from partial consumption of the metal silicide forming metal layer 30 when forming the silicide gate electrode 15. To form the silicide gate electrode 15, the semiconductor structure of FIG. 5 is typically thermally annealed for a time period from about 30 seconds to about 30 minutes, at a temperature from about 300° C. to about 800° C. Alternatively operative thermal annealing methods and conditions may also be used.

Formation of certain silicide phases may fully consume the metal silicide forming metal layer 30. Particular silicide phases are determined by metal selection, amount of metal deposition for a given thickness of silicide gate electrode 15, and anneal temperature. Also, when at least a portion of the reduced thickness silicon gate electode 16' includes a germanium material, then a metal germanide is formed if the metal silicide forming metal layer 30 is also susceptible to forming a metal germanide.

Figure 7:
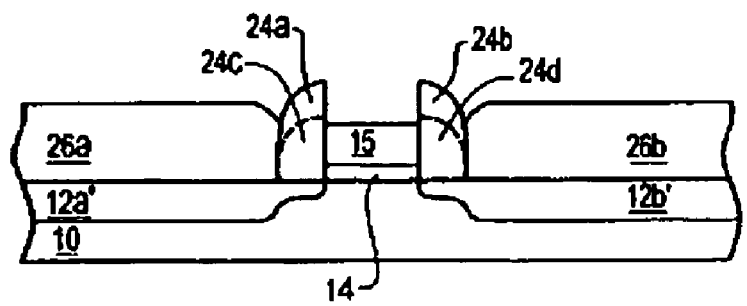

FIG. 7 shows the results of stripping the partially consumed metal silicide forming metal layer 30', and the pair of protective layers 28a and 28b, from the semiconductor structure of FIG. 6. The partially consumed metal silicide forming metal layer 30' may be stripped using methods and materials that are appropriate to its composition. Wet chemical etch methods, dry plasma etch methods and aggregate methods thereof are included as non-limiting examples. Aqueous acidic wet chemical etch methods are particularly common. Specific acid compositions and mixtures typically have a specificity with respect to specific metal silicide forming metals. Similarly, the pair of protective layers 28a and 28b may be stripped using methods and materials that are specific to their materials of composition. Wet chemical methods, dry plasma methods and aggregate methods thereof are also included as non-limiting methods. When the pair of protective layers 28a and 28b comprises a silicon oxide material, they may be stripped using either an aqueous hydrofluoric acid etchant, or alternatively a plasma etch method using a fluorine containing etchant gas composition.

Figure 8:
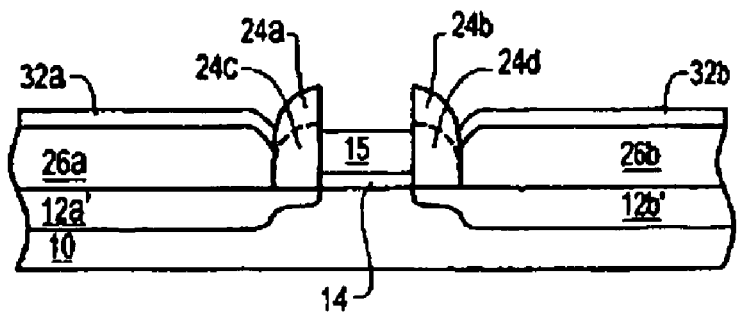

FIG. 8 shows a pair of silicide layers 32a and 32b located upon a pair of partially consumed raised source/drain layers 26a' and 26b'.

The pair of silicide layers 32a and 32b may comprise silicide materials analogous, equivalent or identical to the silicide materials that comprise the silicide gate electrode 15. The pair of silicide layers 32a and 32b may be formed using an analogous self-aligned silicide (i.e., salicide) method (i.e., blanket layer deposition, thermal annealing and excess metal strip) that is used for forming the silicide gate electrode 15. The pair of silicide layers 32a and 32b preferably has a thickness from about 50 to about 200 angstroms. Thus, complete consumption of the pair of partially consumed raised source/drain layers 26a' and 26b' is not intended when forming the pair of silicide layers 32a and 32b.

Finally, within the first embodiment, the pair of silicide layers 32a and 32b located upon the pair of partially consumed raised source/drain layers 26a' and 26b' is formed after silicidation of the reduced height silicon gate electrode 16' when forming the silicide gate electrode 15.

FIG. 8 illustrates a schematic cross-sectional diagram of a field effect transistor in accordance with the first embodiment of the invention. The field effect transistor has: (1) a desirable comparatively wide extension region offset within a pair of intrinsic source/drain regions 12a' and 12b', due to a comparatively wide pair of horizontal spacer layers 24a and 24b; (2) a desirable comparatively low gate electrode capacitance due to thinning of a silicon gate electrode 16 to form a reduced thickness silicon gate electrode 16'; (3) a desirable comparatively low gate electrode resistance by reacting the reduced thickness silicon gate electrode 16' with a metal silicide forming metal layer 30 to form a silicide gate electrode 15; and (4) a generally inverted topography where the reduced thickness silicon gate electrode 16' or silicide gate electrode 15 has a thickness no higher than, or alternatively lower than, a pair of raised source/drain layers 26a and 26b that comprise a pair of "source/drain regions." Optionally, a pair of reduced height spacer layers 24c and 24d may also be included to limit gate electrode fringing capacitance.

FIG. 9 to FIG. 17 show a series of schematic cross-sectional diagrams illustrating the results of progressive stages in fabricating a field effect transistor in accordance with a second embodiment of the invention.

Figure 9:
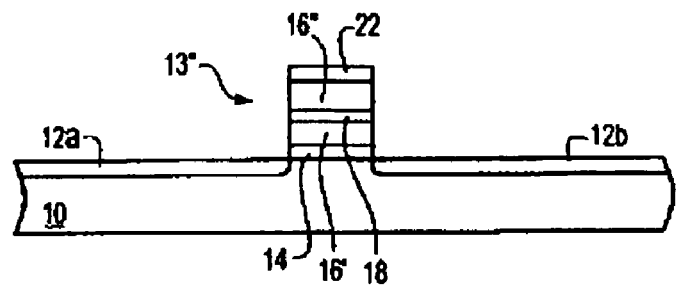
FIG. 9 to FIG. 17 show a series of schematic cross-sectional diagrams illustrating the results of progressive stages in fabricating a field effect transistor device in accordance with a second embodiment of the invention.

The second embodiment of the invention that is illustrated in FIG. 9 to FIG. 17 correlates generally with the first embodiment of the invention that is illustrated in FIG. 1 to FIG. 8. However, as an exception, the gate electrode stack 13" that is illustrated in FIG. 9 (in comparison with the gate electrode stack 13 that is illustrated in FIG. 1) comprises: (1) the gate dielectric 14; (2) the reduced thickness silicon gate electrode 16' located upon the gate dielectric 14; (3) an etch stop layer 18 located upon the reduced thickness silicon gate electrode 16'; (4) a vertical spacer layer 16" located upon the etch stop layer 18; and (5) the capping layer 22 located upon the vertical spacer layer 16".

Of the foregoing layers within the gate electrode stack 13", the gate dielectric 14, the reduced thickness silicon gate electrode 16' and the capping layer 22 are analogous equivalent or identical to the same designated layers within the first embodiment. Attention is drawn to the newly introduced etch stop layer 18 and vertical spacer layer 16".

The etch stop layer 18 is intended to provide etch stop properties with respect to etching and removal of the vertical spacer layer 16". The etch stop layer 18 may thus comprise etch stop materials that are conventional in the semiconductor fabrication art. Non-limiting examples include conductor etch stop materials, semiconductor etch stop materials and dielectric etch stop materials. Most common are dielectric etch stop materials, and more particularly common are silicon oxide or silicon nitride dielectric etch stop materials. The etch stop materials may be formed using any of several methods. Included are thermal or plasma oxidation or nitridation methods, chemical vapor deposition methods and physical vapor deposition methods. Preferably, the etch stop layer 18 comprises a silicon nitride or thermal silicon oxide material that has a thickness from about 20 to about 70 angstroms.

The vertical spacer layer 16" may analogously comprise any of several spacer materials. Non-limiting examples include conductor spacer materials, semiconductor spacer materials and dielectric spacer materials. Preferably, within the second embodiment, the vertical spacer layer 16" comprises a silicon spacer material that has a composition analogous, equivalent or identical to the composition of the reduced thickness silicon gate electrode 16'. Such a silicon spacer material may be deposited using an identical method and materials to those used for depositing the reduced height silicon gate electrode 16', with an additional intervening thermal oxidation process step. Within the second embodiment, the etch stop layer 18 and the vertical spacer layer 16" will together typically have a thickness from about 500 to about 950 angstroms.

Figure 10:
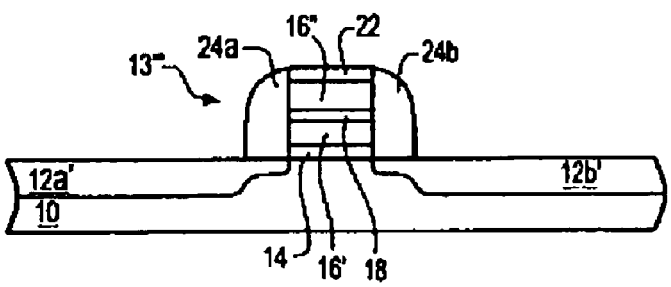

FIG. 10 correlates with FIG. 2, with the exception of the foregoing structural differences in the gate electrode stack 13 (FIG. 1) and the gate electrode stack 13" (FIG. 9), in turn, yielding analogous differences between the spacer clad gate electrode stack 13' (FIG. 2) and a spacer clad gate electrode stack 13''' (FIG. 10).

Figure 11:
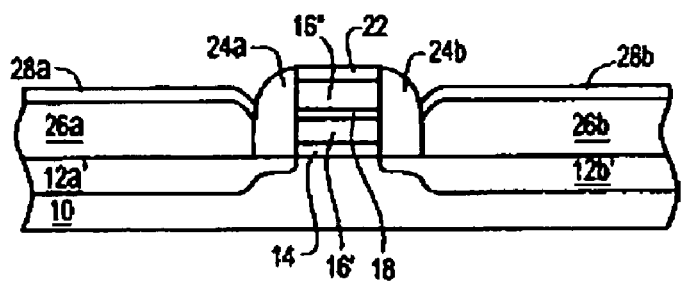

FIG. 11 correlates with FIG. 3 and illustrates analogous or equivalent presence of the pair of raised source/drain layers 26a and 26b and protective layers 28a and 28b. Within the second embodiment, the pair of protective layers 28a and 28b may desirably have an increased thickness in comparison with the etch stop layer 18, under circumstances where the etch stop layer 18 and the pair of protective layers 28a and 28b comprise the same material, such as a preferred silicon oxide material.

Figure 12:
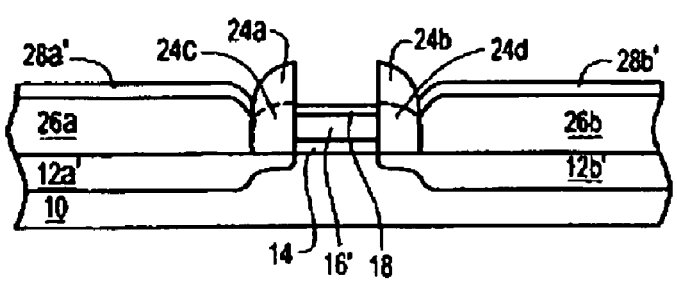

FIG. 12 shows the results of stripping the capping layer 22 and the vertical spacer layer 16" from the semiconductor structure whose schematic cross-sectional diagram is illustrated in FIG. 11. Methods and materials for stripping the capping layer 22 are discussed in greater detail above within the context of the first embodiment. Methods and materials for stripping the spacer layer 16" when the spacer layer 16" is formed of a silicon material, are analogous, equivalent or identical to the methods for etching the silicon gate electrode 16 to yield the reduced thickness silicon gate electrode 16' in accord with the first embodiment. Also, in accordance with the first embodiment, the spacer layers 24a and 24b can be optionally reduced in height by etching as denoted by dashed lines 24c and 24d. The etching of the spacer layers 24a and 24b to from the reduced height spacer layers 24c and 24d may be undertaken before or after exposing the reduced thickness silicon gate electrode 16'.

Primarily, the second embodiment thus differs from the first embodiment by the incorporation and use of an etch stop layer 18 that provides for greater process control when eventually exposing a reduced thickness silicon gate electrode 16'.

Figure 13:
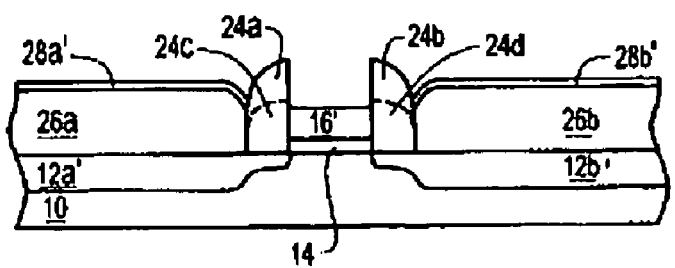

FIG. 13 shows the results of stripping the etch stop layer 18 to leave exposed the reduced thickness silicon gate electrode 16'. In accordance with disclosure above, when the etch stop layer 18 and the pair of protective layers 28a and 28b are formed the same material, such as a silicon oxide material, the pair of protective layers 28a and 28b (which are desirably of greater thickness than the etch stop layer 18) is also simultaneously etched to form a pair of reduced thickness protective layers 28a' and 28b'. Such an etching is not a limitation of the second embodiment, since the etch stop layer 18 and the pair of protective layers 28a and 28b need not necessarily comprise an identical chemical composition. For example, if the etch stop layer 18 is formed of silicon nitride, it can be readily selectively etched by a dry plasma etchant or wet chemical etchant relative to a pair of protective layers 28*a* and 28*b* formed of silicon oxide.

Figure 14:
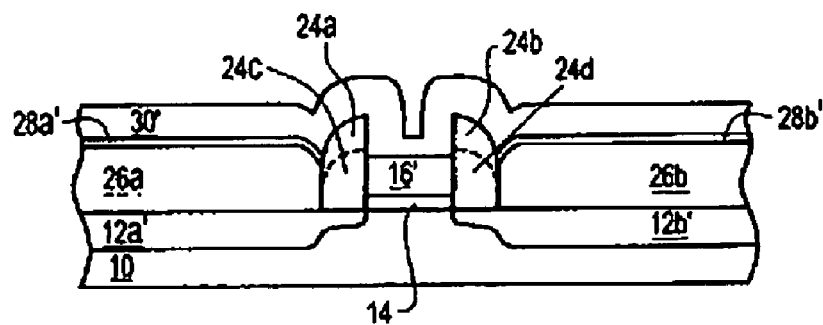
Figure 15:
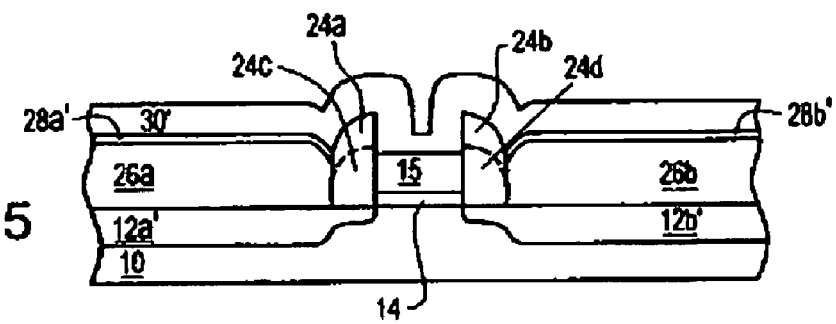

FIG. 14 and FIG. 15 correlate with FIG. 5 and FIG. 6, but with the presence of the pair of reduced thickness protective layers 28*a'* and 28*b'* (FIG. 14 and FIG. 15) in comparison with the protective layers 28*a* and 28*b* (FIG. 5 and FIG. 6).

Figure 16:
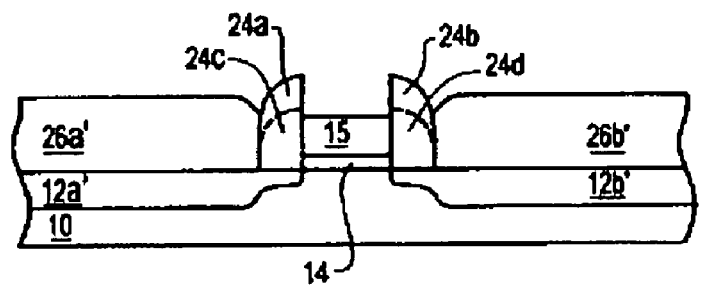
Figure 17:
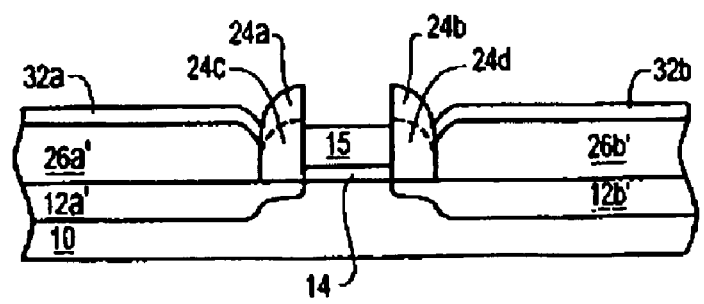

FIG. 16 and FIG. 17 correlate with and are identical with FIG. 7 and FIG. 8.

FIG. 17 shows a schematic cross-sectional diagram of a semiconductor structure in accordance with a second embodiment of the invention. The semiconductor structure is identical with the first embodiment. The second embodiment differs from the first embodiment by using an etch stop layer 18 (FIG. 10 to FIG. 11) when etching a vertical spacer layer 16" in the process of exposing a reduced thickness silicon gate electrode 16'.

The preferred embodiments of the invention are illustrative of the invention rather than limiting of the invention. Revisions and modifications may be made to methods, materials, structures and dimensions in accordance with the preferred embodiments of the invention while still providing an embodiment in accordance with the invention, further in accordance with the accompanying claims.

What is claimed is:

1. A method for fabricating a field effect transistor comprising:

forming an extension region into a semiconductor substrate which includes at least a gate electrode stack thereon, the gate electrode stack serving as a mask, the gate electrode stack comprising a reduced thickness silicon gate electrode, an etch stop layer thereupon and a vertical spacer layer further thereupon;

forming an intrinsic source/drain region into the semiconductor substrate while using the gate electrode stack and a horizontal spacer layer formed adjacent thereto as a mask;

forming a raised source/drain layer upon the semiconductor substrate while using the gate electrode and the spacer layer as a mask, said raised source/drain layer comprising a semiconductor material that is different from the intrinsic source/drain region and wherein a top surface of the raised source/drain layer is higher than a top surface of the reduced thickness gate electrode;

stripping the vertical spacer layer from the gate electrode stack while using the etch stop layer as a stop layer, and then further stripping the etch stop layer to expose the reduced thickness silicon gate electrode;

reacting the exposed reduced thickness silicon gate electrode with a metal silicide forming metal to form a silicide gate electrode; and forming a silicide layer upon the raised source/drain layer.

* * * * *